United States Patent [19]

Itagaki et al.

[11] Patent Number: 5,503,777
[45] Date of Patent: Apr. 2, 1996

[54] THIXOTROPIC CONDUCTIVE PASTE

[75] Inventors: Minehiro Itagaki, Moriguchi; Yoshihiro Bessho, Higashiosaka; Satoru Yuhaku, Osaka; Yasuhiko Hakotani, Nishinomiya; Kazuhiro Miura, Osaka; Kazuyuki Okano, Ikoma, all of Japan

[73] Assignee: Matsushita Electric Industrial Co., Ltd., Osaka, Japan

[21] Appl. No.: 240,376

[22] Filed: May 10, 1994

[30] Foreign Application Priority Data

May 10, 1993 [JP] Japan .................. 5-108492

[51] Int. Cl.$^6$ .................. C09D 5/00; C08K 3/08
[52] U.S. Cl. .................. 252/518; 252/500; 423/326; 501/11; 501/18; 501/20
[58] Field of Search .................. 501/11, 18, 20; 423/326; 252/518, 500

[56] References Cited

U.S. PATENT DOCUMENTS

| | | | |
|---|---|---|---|
| 3,056,684 | 10/1962 | Lopata | 106/14 |
| 3,776,741 | 12/1973 | Bockstie, Jr. | 106/15 FP |
| 3,819,439 | 6/1974 | Taylor | 156/89 |
| 4,024,629 | 11/1975 | Lemoine et al. | 29/625 |
| 4,417,007 | 11/1983 | Salensky et al. | 523/442 |
| 5,029,242 | 7/1991 | Sammet | 174/257 |
| 5,135,829 | 8/1992 | Fukagai et al. | 430/60 |
| 5,156,674 | 10/1992 | Cells | 106/20 |
| 5,167,701 | 12/1992 | Savin | 106/14.41 |
| 5,186,743 | 2/1993 | Flasch | 106/38.35 |
| 5,216,207 | 6/1993 | Prabhu et al. | 174/256 |
| 5,338,348 | 8/1994 | Savin | 106/14.41 |

FOREIGN PATENT DOCUMENTS

| | | |
|---|---|---|
| 0272129 | 6/1988 | European Pat. Off. . |
| 2403880 | 8/1974 | Germany . |
| 62-86602 | 4/1987 | Japan . |
| 3-229489 | 10/1991 | Japan . |
| 3-280414 | 12/1991 | Japan . |
| 5-20920 | 1/1993 | Japan . |
| 1412341 | 11/1975 | United Kingdom . |

OTHER PUBLICATIONS

Hawley's Condensed Chemical Dictionary, Richard J. Lewis Sr., Van Nostrand Reinhold Company, New York 1993.

*Primary Examiner*—Paul Lieberman
*Assistant Examiner*—Wyatt B. Pratt
*Attorney, Agent, or Firm*—Ratner & Prestia

[57] ABSTRACT

A conductive paste includes inorganic material powders containing conductive powders and glass powders, an organic vehicle containing an organic binder and an organic solvent, and a metal organic compound.

4 Claims, 2 Drawing Sheets

THIXOTROPIC CONDUCTIVE PASTE

BACKGROUND OF THE INVENTION

1. Field of the Invention

The present invention relates to a conductive paste, and more particularly to a conductive paste used for interconnecting wiring layers of a ceramic multilayer wiring substrate on which chip components such as an LSI and an IC are mounted.

2. Description of the Related Art

A green sheet stacking method and a thick film printing method have widely been used for producing a ceramic multilayer substrate. These methods respectively have advantages: According to the green sheet stacking method, wiring layers can be formed with high density to provide high density wiring patterns; According to the thick film printing method, its application covers a wide range because of its simplified production process and good production yield.

In the production of the ceramic multilayer substrate, the interconnection of the respective wiring layers is one of the critical techniques. For the interconnection, in general, a via hole is formed in an insulating layer and the via hole (through hole) is filled with a conductive material. These steps are referred to as a via-fill process. In either of the green sheet stacking method or the thick film printing method, when the thickness of the insulating layer is small, the via hole can be filled with a conductive material simultaneously with the formation of a wiring pattern. However, when the thickness of the insulating layer is large, the via-fill process is needed before forming the wiring pattern.

Conventionally, a conductive paste containing, as its main components, a conductive material, inorganic component powders, an organic binder, and a solvent thereof is used for filling the via hole in the via-fill process.

As shown in FIG. 3, in the case where a via hole 2 of a green sheet insulating layer 4 is filled with a conductive paste 5, a solvent contained in the conductive paste 5 penetrates into the green sheet insulating layer 4 as well as evaporates therefrom; as a result, inorganic component powders contained in the conductive paste 5 move to an inner side of the via hole 2. This phenomenon is called leveling. Because of this leveling, a recess 3 is formed in the center of the conductive paste 5. The formation of the recess 3 means a filling defect, which causes an electrical connection failure between wiring layers. Such an electrical connection failure is a fatal defect for a ceramic multilayer substrate.

SUMMARY OF THE INVENTION

The conductive paste of this invention, comprises inorganic material powders containing conductive powders and glass powders, an organic vehicle containing an organic binder and an organic solvent, and a metal organic compound.

In one embodiment of the present invention, the metal organic compound is contained in an amount of at least 0.5% by weight.

In another embodiment of the present invention, the metal organic compound is organic acid metal salt.

In another embodiment of the present invention, the organic acid metal salt is metal 2-ethylhexanoate.

In another embodiment of the present invention, the metal 2-ethylhexanoate is a compound selected from the group consisting of silicon 2-ethylhexanoate, copper 2-ethylhexanoate, silver 2-ethylhexanoate, titanium 2-ethylhexanoate, zirconium 2-ethylhexanoate, and vanadium 2-ethylhexanoate.

In another embodiment of the present invention, the metal organic compound is silicon alkoxide.

In another embodiment of the present invention, the silicon alkoxide is a compound selected from the group consisting of tetrabenzyl orthosilicate, tetramethyl orthosilicate, tetraethyl orthosilicate, and tetrabutyl orthosilicate.

In another embodiment of the present invention, the organic vehicle includes a butyral type resin.

A conductive paste for a ceramic wiring substrate comprises: 75.0 to 90.5% by weight of inorganic component containing conductive material powders and glass powders; 9.0 to 20.0% by weight of organic vehicle component containing at least an organic binder and a solvent; and 0.5 to 5.0% by weight of metal organic compound.

In one embodiment of the present invention, the metal organic compound contains at least silicon alkoxide and an organic acid metal salt.

In another embodiment of the present invention, the organic vehicle contains a butyral type resin.

In another embodiment of the present invention, the metal organic compound contains the same element as an element constituting the conductive material powders.

When the metal organic compound is added to the conductive paste including an organic vehicle and an inorganic material component containing conductive material powders, the metal organic compound is reacted with the organic vehicle and the inorganic material component to increase thixotropy of the paste. Because of this increased thixotropy, the paste will have high viscosity with respect to low-speed deformation such as natural flow and has low viscosity with respect to high-speed deformation caused by rapid force. Thus, even though the viscosity with respect to natural flow is increased so as to prevent the center portion of the conductive paste from being recessed in the via-hole because of the leveling, the viscosity resistance of the conductive paste while being filled in the via hole becomes small. As a result, the via hole can be easily filled with the paste without any insufficient filling and a filling defect, i.e. the recess of the center portion of the conductive past in the via hole is not caused.

Thus, the invention described herein makes possible the advantage of providing a conductive paste for use in the interconnection of wiring layers of a ceramic wiring substrate, causing no filling defect, i.e., recess in its Center portion formed by the leveling in the via-fill process.

This and other advantages of the present invention will become apparent to those skilled in the art upon reading and understanding the following detailed description with reference to the accompanying figures.

DESCRIPTION OF THE PREFERRED EMBODIMENTS

Figure 1:
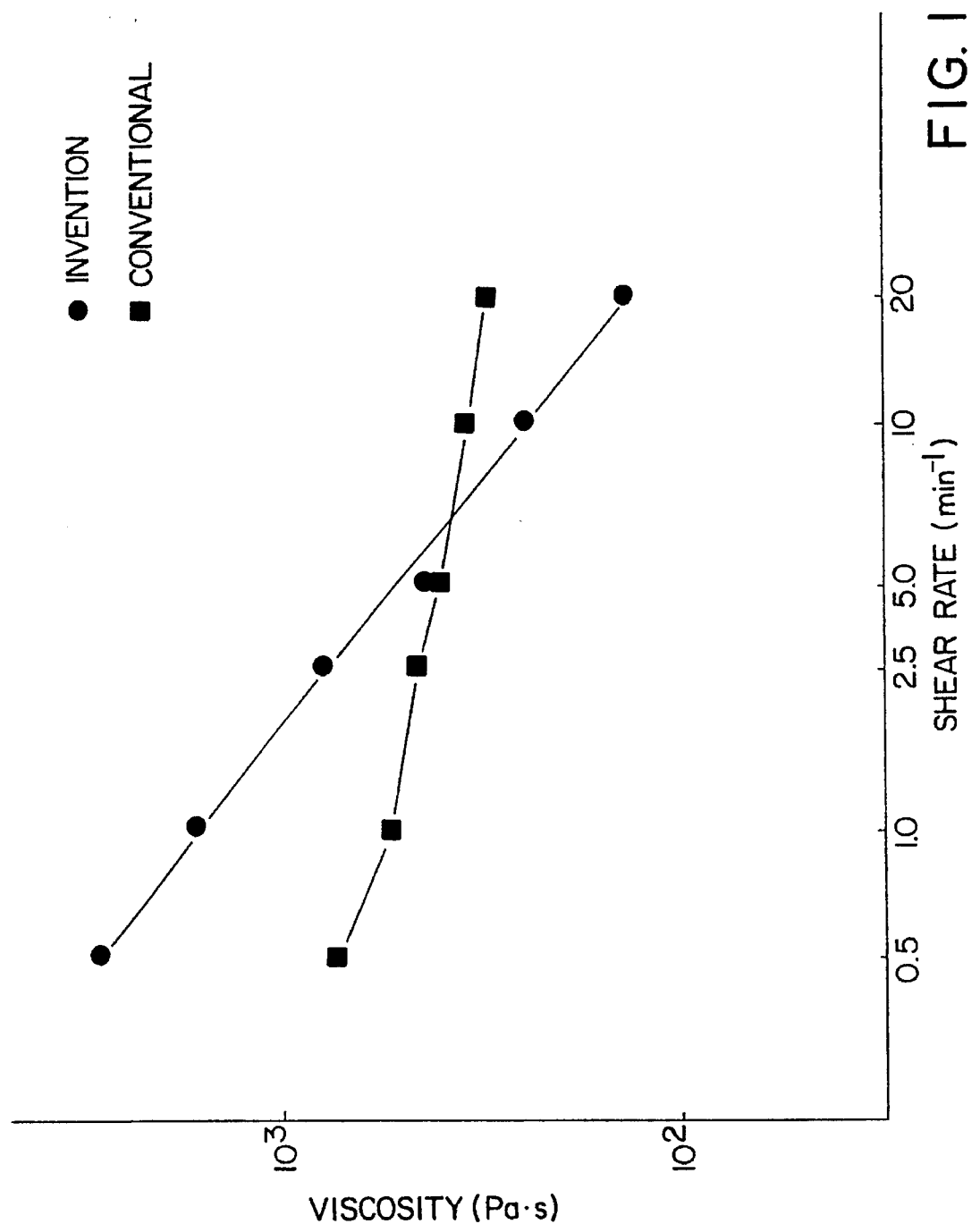
FIG. 1 is a graph showing the viscosity characteristic of a conductive paste of the present invention.

Hereinafter, the present invention will be described by way of an illustrative example with reference to the drawings.

A conductive paste of the present invention includes an inorganic material component containing conductive material powders and glass powders, an organic vehicle, and a metal organic compound.

The inorganic material component is composed of the conductive material powders for providing a conductive paste with conductivity and the glass powders working as a binder. As the inorganic material component of the present invention, materials used for the conventional conductive paste can be used. Examples of the conductive material powders include gold, silver, copper, palladium, nickel, ruthenium, platinum, molybdenum, tungsten, and alloys thereof. Alternatively, as described later, oxides of these metals can be used as the inorganic material component. In this case, the oxide is reduced after the via hole is filled with the paste. The conductive material powders have an average particle size preferably in the range of 0.5 to 50 μm, and more preferably in the range of 5 to 10 μm. It is preferred that the glass powders are softened at temperatures higher than a sintering initiation temperature of a green sheet insulating material. The glass powders have an average particle size preferably in the range of 0.1 to 20 μm, and more preferably in the range of 0.5 to 5 μm.

As the organic vehicle, resins used for the conventional conductive paste dissolved in an organic solvent can be used. Examples of the resins include polyvinyl butyral, polyvinyl alcohol, or a mixed resin in which at least one of ethyl cellulose, acrylic resin (e.g., methyl methacrylate, isobutyl methacrylate, isodecyl methacrylate, glycidyl methacrylate, or copolymers thereof), and phenol resin is added in an amount of not more than 50% by weight to polyvinyl butyral or polyvinyl alcohol. Butyral resin is preferably used. These resins are diissolved in organic solvents to obtain organic vehicles. Any organic solvents which can dissolve these resins can be used. Butyl carbitol, butyl carbitol acetate, terpineol, and the like are preferably used as the organic solvent. The resin concentration in the organic vehicle is preferably in the range of 3 to 40% by weight and more preferably in the range of 5 to 20% by weight.

As the metal organic compound, a metal organic complex, in which acid or an organic compound containing oxygen such as alcohol and aldehyde is ligated or bonded to metal via oxygen, is preferred. Alternatively, an organic complex of silicon or boron can be used. Specifically, organic acid metal salts, orthosilicate ester (silicon alkoxide), and the like are preferred. Any organic acid metal salt (metal soap) can be used for the conductive paste of the present invention; However, commercially available metal salts of synthetic organic acid having a predetermined chemical composition are preferred. For example, considering practical application, metal 2-ethylhexanoate is preferred because of its easy commercial availability. Examples of the metal 2-ethylhexanoate include silicon 2-ethylhexanoate, copper 2-ethylhexanoate, silver 2-ethylhexanoate, titanium 2-ethylhexanoate, zirconium 2-ethylhexanoate, and vanadium 2-ethylhexanoate. These metal 2-ethylhexanoates are available from Asahi Denka Kogyo K.K. Examples of the silicon alkoxide include tetrabenzyl orthosiilicate (silicon tetrabenzoxide), tetramethyl orthosiilicate (silicon tetramethoxide), tetraethyl orthosilicate (silicon tetraethoxide), and tetrabutyl orthosilicate (silicon tetrabutoxide). Tetrabenzyl orthosilicate is available from Nippon Kineki Co., Ltd. and other orthosilicate compounds are available from Tokyo Kasei Kogyo Co., Ltd., respectively. A neodecane acid salt is also suitable as the metal organic compound of the present invention because of its commercial availability. In addition, titanium alkoxide (titanic acid ester) having a structure similar to that of silicon alkoxide can also be used.

In the case where the above-mentioned metal organic compound is used in the present invention, it is preferred that metal is the same element as that contained in the conductive material powders, glass powders, or ceramics used for an insulating layer. Furthermore, as the metal organic compound, organic metal σ-bonded to or π-bonded to a carbon atom of the organic compound can be used. In the case of using these organic metals, organic metals capable of being dissolved in an organic solvent at high concentration should be selected.

The conductive paste of the present invention can be obtained by mixing and kneading the above-mentioned materials by a known method: A small amount of metal organic compound is added to a mixture in which the inorganic material component and the organic vehicle are mixed in a ratio used in the conventional conductive paste, whereby the conductive paste of the present invention can be obtained. More specifically, it is preferred that at least 0.5% metal organic compound is contained in the conductive paste to be obtained. In the case where less than 0.5% of the metal organic compound is contained in the conductive paste, the conductive paste to be obtained will not have sufficient thixotropy for a via-fill. With the increase in the adding amount of the metal organic compound, the thixotropic characteristics are improved; however, when the adding amount is more than about 5.0%, the thixotropic characteristics will not improve any more. That is, the excess amount of the metal organic compound decreases the content of the inorganic material component, resulting in insufficient filling after sintering of the paste. Thus, the conductive paste of the present invention preferably includes 75.0 to 90.5% by weight of the inorganic material component containing conductive material powders and glass powders, 9.0 to 20.0% by weight of the organic vehicle containing the organic binder and the solvent, and 0.5 to 5.0% by weight of the metal organic compound, based on the total weight of the conductive paste.

A conductive paste having high thixotropy has high viscosity with respect to low-speed deformation such as natural flow and has low viscosity with respect to high-speed deformation caused by rapid force. Because of this characteristic, even though the viscosity with respect to natural flow is increased so as to prevent the center portion of the conductive paste from being recessed in the via-hole because of the leveling, the viscosity resistance of the conductive paste while being filled in the via hole becomes small. As a result, the via hole can be easily filled with the paste without any insufficient filling and filling defect, i.e. the recess of the center portion of the conductive past in the via hole is not caused. It is considered that the conductive paste will have thixotropy by including the metal organic compound as follows: When the metal organic compound is added to the mixture of the inorganic material component and the organic vehicle, the conductive material powders and glass powders contained in the organic vehicle are loosely bonded together to form a gel.

Hereinafter, the present invention will be described with reference to FIGS. 1 to 3.

EXAMPLE 1

First, 40.8% by weight of silver powders, 40.8% by weight of glass powders, 16.4% by weight of organic vehicle, and 2.0% by weight of tetrabenzyl orthosilicate are sufficiently mixed and kneaded using a three; roll mill to obtain a conductive paste. As the silver powders, those having an average particle size of about 3 μm, available from Fukuda Metal Foil & Powder Co., Ltd. are used. As the glass powders, GA13 (Trade Name) available from Nippon Electric Glass Co., Ltd. is used. As the organic vehicle, terpineol solution in which 5% by weight of butyral resin is dissolved is used.

The results obtained by measuring the conductive paste with a B-type viscometer will be shown. As the B-type viscometer, RVTD (spindle: SC4-14) manufactured by Brookfield Corp. is used. The conductive paste is inserted into a spindle, and the spindle is rotated for a predetermined times. The viscosity of the conductive paste is obtained in terms of the resistance of the paste during rotation. FIG. 1 shows a viscosity curve of the conductive paste of the present inventions, obtained by the measurement. FIG. 1 also shows a viscosity curve of a conventional example for comparison.

Figure 2:
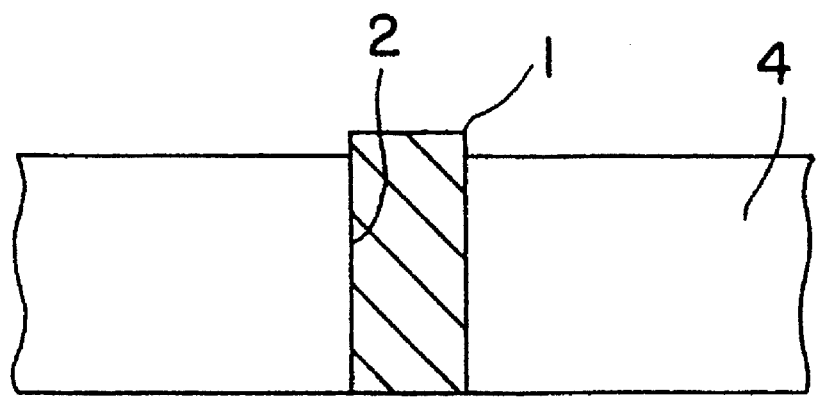
FIG. 2 is a schematic cross-sectional view of a via hole filled with the conductive paste of the present invention.

As is apparent from FIG. 1, when the shear rate is low, the conductive paste of the present invention has high viscosity compared with the conventional conductive paste. In contrast, when the shear rate is high, the conductive paste of the present invention has low viscosity compared with the conventional conductive paste. The ratio (thixotropic index) of the viscosity at 20 $\text{min}^{-1}$ to the viscosity at 0.5 $\text{min}^{-1}$ of the conductive paste of the present invention is about three times that of the conventional conductive paste. Thus, the conductive paste of the present invention has sufficiently large viscosity at a low shear rate (i.e., 0.5 $\text{min}^{-1}$) and has small viscosity at a high shear rate (i.e., 20 $\text{min}^{-1}$). The low shear rate corresponds to the case where the conductive paste is slowly pressured so as to effect the leveling; The high shear rate corresponds to the case where the conductive paste is rapidly pressured as in the filling of the via hole.

The relationship between the added amount of the metal organic compound contained in the conductive paste of the present invention and the thixotropic index is shown in the following Table. The table shows the thixotropic index of the conductive paste prepared by the above-mentioned method, when using tetrabenzyl orthosilicate and silicon 2-ethylhexanoate are used as the metal organic compound. As shown in Table, the addition of merely 0.5% by weight of the metal organic compound brings about marked effects.

| Metal organic compound | Adding amount (%) | Thixotropic index (0.5/20) | Viscosity (Pa · s/20 $\text{min}^{-1}$) |
| --- | --- | --- | --- |
| Tetrabenzyl orthosilicate | 0.5 | 8.0 | 150 |
|  | 1.0 | 17.2 | 200 |
|  | 2.0 | 13.6 | 275 |
| Silicon 2-ethyl-hexanoate | 0.0 | 1.7 | 110 |
|  | 0.5 | 4.5 | 130 |
|  | 1.0 | 5.3 | 160 |
|  | 2.0 | 10.8 | 400 |
|  | 4.0 | 9.7 | 343 |
|  | 10.0 | 10.8 | 426 |

Hereinafter, a method for producing a ceramic multilayer substrate, using the conductive paste of the present invention by a green sheet stacking method will be described.

An organic vehicle and benzylbutyl phthalate are respectively prepared. In the organic vehicle, a glass ceramic material (MLS 1000, manufactured by Nippon Electric Glass Co., Ltd.) capable of being sintered at 900° C. composed of lead borosilicate glass powders and alumina powders and acrylic resin are dissolved in methylsethyl ketone. The organic vehicle and benzylbutyl phthalate are sufficiently mixed by a pot mill. Then, the mixture thus obtained is casted by a doctor blade method to obtain a green sheet insulating layer 4, as shown in FIG. 2. In the green sheet insulating layer 4, a via hole 2 is formed by punching. The via hole 2 is filled with the conductive paste 1 by squeezing under the condition that the portions of the surface of the green sheet insulating layer 4 other than the via hole 2 is masked. When relatively strong force such as squeezing is applied to the conductive paste 1 at a high speed, the viscosity of the conductive paste 1 is decreased while the flowability thereof is increased; therefore, the via hole 2 is filled with the conductive paste 1 without any insufficient filling. After filling, the conductive paste 1 has high viscosity with respect to force applied at a low speed such as natural flow caused by the gravity and evaporation of the solvent. Therefore, the center portion of the conductive paste 1 filled in the via hole 2 is not recessed.

Next, a wiring pattern is formed on the green sheet insulating layer 4 by screen printing with a thick film conductive paste for wiring (DD1411, manufactured by Kyoto Elex Co., Ltd. ). Likewise, a plurality of green sheet. insulating layers 4 with a wiring pattern formed thereon are prepared. Each green sheet insulating layer 4 is pressed by heating under the condition of 80° C. and 200 kg/cm$^2$ to obtain a layered body. It is noted that a wiring pattern is not formed on the uppermost layer of the layered body and only the via hole 2 is formed therein.

Next, a binder is removed from the layered body thus obtained in the air in a heating furnace at a peak temperature of 275° C. The peak temperature is retained for 360 minutes. Furthermore, the layered body is sintered and baked in the air of the heating furnace at a peak temperature of 900° C. In this case, the peak temperature is retained for 10 minutes.

Finally, a wiring pattern is formed on the uppermost layer with a thick film conductive paste (DD2332H, manufactured by Kyoto Elex Co., Ltd.) by screen printing. The layered body is baked at a peak temperature of 900° C. to obtain a ceramic multilayer wiring substrate. In this case, the peak temperature is retained for 10 minutes.

Figure 3:
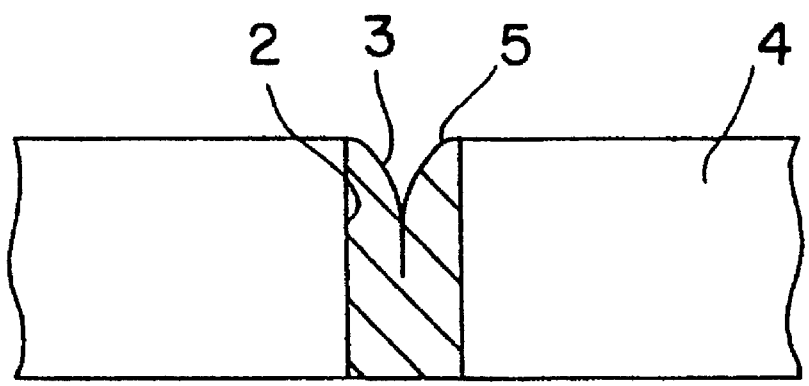
FIG. 3 is a schematic cross-sectional view of a via hole filled with a conventional conductive paste.

For comparison, as shown in FIG. 3, the via hole 2 is filled with a conventional conductive paste 5 to obtain a ceramic multilayer wiring substrate in the same process. Unlike the present invention, the center portion of the conductive paste 5 is recessed (recess 3) due to the leveling. In the case where a conductive paste in which the organic vehicle is greatly decreased in amount is used for the purpose of preventing the conductive paste 5 from moving into an inner side of the via hole 2, the recess of the conductive paste 5 becomes small after filling. However, it is difficult to fill the via hole 2 with this conductive paste because of its high viscosity, which may lead to a filling defect.

Hereinafter, another example using copper oxide powders will be described.

EXAMPLE 2

First, 40.8% by weight of copper oxide powders (CB250, manufactured by Kyoto Elex Co., Ltd.) having an average particle size of about 5 μm, 40.8% by weight of glass powders (GA13, manufactured by Nippon Electric Glass Co., Ltd.), 16.4% by weight of organic vehicle in which butyral resin is dissolved in terpineol to achieve a concentration of 5.0% by weight, and 2.0% by weight of copper 2-ethylhexanoate are respectively prepared. These materials are sufficiently mixed and kneaded using a three roll mill to obtain a conductive paste 1. The viscosity of the conductive paste thus prepared is almost the same as that shown in FIG. 1. Compared with the viscosity curve of the conventional conductive paste, the conductive paste 1 of the present example has a thixotropic index three times as high as that of the conventional one.

An organic vehicle and benzylbutyl phthalate are respectively prepared. In the organic vehicle, a glass ceramic material (MLS1000, manufactured by Nippon Electric Glass Co., Ltd.) which is the same as that of Example 1 and acrylic resin are dissolved in methyl ethyl ketone. The organic vehicle and benzylbutyl phthalate are sufficiently mixed by a pot mill. Then, the mixture thus obtained is casted by a doctor blade method to obtain a green sheet insulating layer 4.

In the green sheet insulating layer 4, a via hole 2 is formed by punching. The via hole 2 is filled with the conductive paste 1. In the same way as Example 1 shown in FIG. 2, the center portion of the conductive paste 1 filled in the via hole 2 is not recessed. Then, a wiring pattern is formed by screen printing with a thick film conductive paste for wiring (DD3100, manufactured by Kyoto Elex Co., Ltd.).

Likewise, a plurality of green sheet insulating layers 4 with a wiring pattern formed thereon are prepared. Each green sheet insulating layer 4 is pressed by heating under the condition of 80° C. and 200 kg/cm$^2$ to obtain a layered body. It is noted that a wiring pattern is not formed on the uppermost layer of the layered body and only the via hole 2 is formed therein. A binder is removed from the layered body thus obtained in the air in a heating furnace at a peak temperature of 500° C. The peak temperature is retained for 2 hours.

Next, a copper oxide which is a conductive material in the layered body is reduced to copper in an atmosphere of hydrogen in the heating furnace at a peak temperature of 250° C. The peak temperature is retained for 5 hours. Then, the layered body is sintered and baked in an atmosphere of nitrogen in the heating furnace at a peak temperature of 900° C. In this case, the peak temperature is retained for 10 minutes.

Finally, a wiring pattern is formed on the uppermost layer with a thick film conductive paste (QP153, manufactured by Dupont) by screen printing. The layered body is baked in an atmosphere of nitrogen at a peak temperature of 900° C. to obtain a ceramic multilayer wiring substrate. In this case, the peak temperature is retained for 10 minutes.

In the above-mentioned examples, the metal organic compound containing the same element as that of the conductive material powders is used. Thus, unwanted reaction of the inorganic component is not effected by heating, pressing, and reduction during the production of the multilayer wiring substrate; For this reason, the multilayer wiring substrate to be obtained has stable characteristics. It is noted that the metal of the metal organic compound is not necessarily the same element as that of the conductive material powders. However, it is preferred that the metal of the metal organic compound is not reacted with a material for the green sheet insulating layer under heating, pressing, and reduction conditions during the production of the multilayer wiring substrate. For example, the metal organic compound including metals such as silicon, boron, aluminum, and titanium can be used.

In the above examples, the production of the multilayer wiring substrate using the conductive paste of the present invention is described; However, it should be understood that the present invention can also be applied to the production of a double-sided wiring substrate (thickness of the green sheet is about 0.6 mm or more). Furthermore, in the above examples, the conductive paste for being filled in the via hole is described. The conductive paste can also be used for forming a wiring pattern. In the past, the end portions of the wiring pattern were deformed due to the leveling when the wiring pattern was formed, resulting in an enlarged wiring pattern. However, the use of the conductive paste according to the present invention can overcome this problem.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A conductive paste comprising:

inorganic material powders containing conductive material powders and glass powders, wherein the conductive material powders are selected from the group consisting of gold, copper nickel ruthenium, platinum, molybdenum, tungsten, and alloys and oxides thereof;

an organic vehicle containing an organic binder and an organic solvent, wherein the organic binder is at least one organic resin selected from the group consisting of polyvinyl butyral resin, polyvinyl alcohol resin, butyral resin, acrylic resin and phenol resin; and an organic acid metal salt, wherein the organic acid metal salt is a compound selected from the group consisting of silicon 2-ethylhexanoate, silver 2-ethylhexanoate, titanium 2-ethylhexanoate, and vanadium 2-ethylhexanoate.

2. A conductive paste according to claim 1, wherein the organic acid metal salt is contained in an amount from 0.5% to 5.0% by weight.

3. A conductive paste for a ceramic wiring substrate, comprising:

75.0 to 90.5% by weight of an inorganic component containing conductive material powders and glass powders, wherein the conductive material powders are selected from the group consisting of gold, copper, nickel, ruthenium, platinum, molybdenum, tungsten, and alloys and oxides thereof;

9.0 to 20.0% by weight of an organic vehicle component containing at least an organic binder and a solvent, wherein the organic binder contains at least one organic resin selected from the group consisting of polyvinyl butyral resin, polyvinyl alcohol resin, butyral resin, acrylic resin and phenol resin; and 0.5 to 5.0% by weight of an organic acid metal salt, wherein the organic acid metal salt is a compound selected from the group consisting of silicon 2-ethylhexanoate, silver 2-ethylhexanoate, titanium 2-ethylhexanoate, and vanadium 2-ethylhexanoate.

4. A conductive paste according to claim 3, wherein the conductive material powders contain the same metal as contained in the metal organic compound.

\* \* \* \* \*

UNITED STATES PATENT AND TRADE MARK OFFICE
CERTIFICATE OF CORRECTION

PATENT NO. : 5,503,777
DATED : April 2, 1996
INVENTOR(S) : Itagaki et al.

It is certified that error appears in the above-identified patent and that said Letters Patent is hereby corrected as shown below:

Column 8, line 25, insert --,-- after the word copper.

Column 8, line 25, insert --,-- after the word nickel.

Signed and Sealed this

First Day of October, 1996

BRUCE LEHMAN

Attest:

Attesting Officer

Commissioner of Patents and Trademarks